US011493180B2

(12) United States Patent
Alrasheed

(10) Patent No.: US 11,493,180 B2
(45) Date of Patent: Nov. 8, 2022

(54) CLEANSING LAMP UTILIZING METAL-ORGANIC FRAMEWORK

(71) Applicant: Abdullah Alrasheed, Los Angeles, CA (US)

(72) Inventor: Abdullah Alrasheed, Los Angeles, CA (US)

(*) Notice: Subject to any disclaimer, the term of this patent is extended or adjusted under 35 U.S.C. 154(b) by 0 days.

(21) Appl. No.: 17/368,640

(22) Filed: Jul. 6, 2021

(65) Prior Publication Data
US 2022/0010937 A1 Jan. 13, 2022

Related U.S. Application Data

(60) Provisional application No. 63/049,458, filed on Jul. 8, 2020.

(51) Int. Cl.
F21S 9/04 (2006.01)
F21S 9/02 (2006.01)
F21V 33/00 (2006.01)
F21S 8/08 (2006.01)
F21Y 115/10 (2016.01)
B01D 53/62 (2006.01)
B01D 53/82 (2006.01)
H01L 35/30 (2006.01)

(52) U.S. Cl.
CPC .............. *F21S 9/04* (2013.01); *B01D 53/62* (2013.01); *B01D 53/82* (2013.01); *F21S 8/085* (2013.01); *F21S 9/02* (2013.01); *F21V 33/006* (2013.01); *H01L 35/30* (2013.01); *B01D 2253/204* (2013.01); *B01D 2257/504* (2013.01); *F21Y 2115/10* (2016.08)

(58) Field of Classification Search
CPC .............. F21L 13/00; F21L 13/02; F21L 4/08
See application file for complete search history.

(56) References Cited

U.S. PATENT DOCUMENTS

| | | | | |
|---|---|---|---|---|
| 7,799,120 B2 * | 9/2010 | Yaghi | ................. | B01J 20/226 95/91 |
| 8,017,787 B2 | 9/2011 | Ragini et al. | | |
| 9,593,132 B2 | 3/2017 | Schroder et al. | | |
| 9,776,165 B2 | 10/2017 | Tour et al. | | |
| 10,640,954 B2 | 5/2020 | Kim et al. | | |
| 10,800,968 B2 | 10/2020 | Li et al. | | |
| 2004/0124766 A1 * | 7/2004 | Nakagawa | ......... | H01L 51/0064 313/506 |
| 2007/0178332 A1 * | 8/2007 | Ragini | ............... | C07F 15/0033 546/10 |

(Continued)

FOREIGN PATENT DOCUMENTS

DK 3106780 2/2018

*Primary Examiner* — William J Carter
(74) *Attorney, Agent, or Firm* — Robert McConnell; McConnell Law Firm, P.C.

(57) ABSTRACT

An LED lighting fixture powered by a Metal-Organic Framework heat battery. The heat battery is formed of a canister, a MOF container comprised of a plurality of MOF tunnels, each MOF tunnel containing a powdered MOF material, a gate, and a plurality of thermoelectric devices. Below a certain adsorption activation temperature, the MOF material adsorbs a gas from the atmosphere. Above a certain desorption activation temperature, the MOF desorbs the gas. The heat from the adsorption is used to generate electrical current. The desorbed gas is captured to remove it from the atmosphere.

11 Claims, 13 Drawing Sheets

(56) References Cited

U.S. PATENT DOCUMENTS

| | | | |
|---|---|---|---|
| 2010/0012165 A1* | 1/2010 | Bedard | H01L 35/28 362/184 |
| 2014/0049950 A1* | 2/2014 | Vazquez | F21L 13/00 362/157 |
| 2014/0061540 A1 | 3/2014 | Long et al. | |
| 2020/0361965 A1 | 11/2020 | Yaghi et al. | |
| 2021/0156124 A1 | 5/2021 | Yaghi et al. | |

* cited by examiner

CLEANSING LAMP UTILIZING METAL-ORGANIC FRAMEWORK

PRIORITY

This application claims priority to Provisional Patent Application Ser. No. 63/049,458 filed on Jul. 8, 2020.

BACKGROUND OF THE INVENTION

Field of the Invention

The content of this patent application is directed to a novel lighting device that utilizes the ability of Metal-Organic Framework (MOFs) to adsorb and desorb various gases, specifically $CO_2$, to produce heat, generate electricity from the produced heat and remove $CO_2$ from the atmosphere. Under certain temperature conditions, MOFs adsorb gases, in this case CO2, from the atmosphere. This adsorption process is exothermic, i.e., producing heat. The excess heat from this gas adsorption process, when applied to one side of a thermoelectric device, can be used to create a heat battery. The heat gradient created by this application of heat to the thermoelectric devices generates electrical current. This electrical current is used to power a LED lamp.

Under higher temperature conditions, MOFs desorb the adsorbed gas. This gas can be captured and stored in a storage cylinder. The stored gases can be permanently removed from the atmosphere, which is particularly helpful with $CO_2$.

Description of Background Art

Metal-Organic Framework (MOF) is a solid crystalline pores material with a well-defined structure and high surface area. Work in MOFs started in the 1990s and MOF development was led by Prof. Susumu Kitagawa (Kyoto University) and Prof. Omar Yaghi (UC. Berkeley).

Work on MOF's aimed at designing compounds possessing very large pores and high surface areas. Due to the ability to load gas molecules inside MOFs, wide applications of these devices are established.

The early development of MOFs aimed to achieve higher surface area as a solid pore crystalline material for gas storage application. However, with more investigation and discovery with MOFs, new applications have started to appear. Since the framework fixes the molecule in specific orientation, geometry, and spatial arrangement, the change we speak of can take place at a specific site (0D), along a certain path (1D), over molecules lying on a "flat" surface (2D), or over the entire crystal (3D)". Over time, the concept of "Water Harvesting" become attached to MOFs and more research supported the concept of producing water from air with low energy and high purity in a daily circulation base. Green energy applications such as capturing carbon dioxide and other contaminant opened a new window to use these materials in industry for gas purification. Moreover, MOFs have received attention in catalysis research either being used as support for nano-catalyst or creating open metal sites in the SBUs to act as catalysts. In addition, mechanochemical studies into MOFs shows their ability to absorb shockwaves in mechanical application due to the flexible features of the framework in some MOFs.

In addition to the major applications of MOFs described above such as catalysis, gas separation and gas capture/storage, MOFs also can be used as templates for growing uniform structure carbons and polymer material.

Thermoelectric generators are solid-state thermal motors consisting of two main junctions, known as P-type (elevated positive charge concentration) and N-type (elevated negative charge concentration). Essential concepts related to thermoelectric generators are the Seebeck effect and the Peltier effect. The Seebeck effect is the generation of electrical voltage (current) in a curve consisting of two kinds of materials that are connected to a hot junction on one side and a cold junction on the other side. The temperature gradient creates the charge flow. The two dissimilar metals connected to form two junctions (curve) is called a thermocouple. On the other hand, the Peltier effect creates a temperature difference by applying a voltage between two electrical junctions connected to a semiconductor. The Peltier effect is used for cooling. These two effects are the inverse of the other.

Prior art patents in this area describe the use of MOFs to harvest water from the atmosphere but do not describe using heat generated in this process to generate electricity or light.

The following technical references are provide additional detail related to MOFs and thermoelectrics, and are herein incorporated by reference:

V. Blay, L. F. Bobadilla and A. Cabrera-Garcia, Zeolites and Metal-Organic Frameworks From Lab to Industry, Amsterdam: Amsterdam University Press., 2018.

Jianwei Renab, "Structural defects in metal-organic frameworks (MOFs): Formation, detection and control towards practices of interests," Coordination Chemistry Reviews, vol. 349, no. 15 Ocober, pp. 169-197, 2017.

Nathaniel L. Rosi, "Hydrogen Storage in Microporous," Science, vol. 300, no. 5622, pp. 1127-1129, 2003.

Omar M. Yaghi, Introduction to Reticular Chemistry: Metal-Organic Frameworks and Covalent Organic Frameworks, Weinheim, Germany: Wiley-VCH, 2019.

Meili Ding, "Carbon capture and conversion using metal-organic frameworks and MOF-based materials," Chemical Society Reviews, vol. 48, no. 10, pp. 2783-2828, 2019.

David Britt, "Highly efficient separation of carbon dioxide by a metal-organic framework replete with open metal sites," PNAS, vol. 49, no. December 8, pp. 20637-20640, 2009.

O. M. Yaghi, "Reticular Chemistry in All Dimensions," ACS Central Science, vol. 5, no. 8, pp. 1295-1300, 2019.

Nikita Hanikel, "Rapid Cycling and Exceptional Yield in a Metal-Organic Framework Water Harvester," ACS Central Science, vol. 5, no. 10, pp. 1699-1706, 2019.

Xuan Zhou, "Shock Wave Energy Absorption in Metal-Organic Framework," Journal of the American Chemical Society, vol. 141, no. 6, pp. 2220-2223, 2019.

Pascal G. Yot, "Metal-organic frameworks as potential shock absorbers: the case of the highly flexible MIL-53 (Al)," Chemical Communications, vol. 50, no. 67, pp. 9462-9464, 2014.

Young, Christine, et al. "Controlled Chemical Vapor Deposition for Synthesis of Nanowire Arrays of Metal-Organic Frameworks and Their Thermal Conversion to Carbon/Metal Oxide Hybrid Materials." Chemistry of Materials, vol. 30, no. 10, 2018, pp. 3379-3386., doi:10.1021/acs.chemmater.8b00836.

Youn, Han-Kyol, et al. "MWCNT Synthesis over Fe-BTC as a Catalyst/Carbon Source via CVD." Materials Letters, vol. 65, no. 19-20, 2011, pp. 3055-3057., doi:10.1016/j.matlet.2011.06.081.

Day, Robert W., et al. "Single Crystals of Electrically Conductive Two-Dimensional Metal-Organic Frameworks: Structural and Electrical Transport Properties."

ACS Central Science, vol. 5, no. 12, October 2019, pp. 1959-1964., doi:10.1021/acscentsci.9b01006

Liu, Y., Guo, J., Zhu, E., Liao, L., Lee, S., Ding, M., . . . Duan, X. (2018). Approaching the Schottky-Mott limit in van der Waals metal-semiconductor junctions. Nature, 557(7707), 696-700. doi:10.1038/s41586-018-0129-8

Liu, Teng, et al. "Self-Sacrificial Template-Directed Vapor-Phase Growth of MOF Assemblies and Surface Vulcanization for Efficient Water Splitting." Advanced Materials, vol. 31, no. 21, October 2019, p. 1806672., doi:10.1002/adma.201806672.

Yang, Hui, et al. "Metal-Organic Framework Nanocrystals as Sacrificial Templates for Hollow and Exceptionally Porous Titania and Composite Materials." Inorganic Chemistry, vol. 54, no. 19, 2015, pp. 9483-9490., doi: 10.1021/acs.inorgchem.5b01352.

Omar M. Aghi, Introduction to Reticular Chemistry, Weinheim: Wiley-VCH, 2019.

Y. Peng, "Application of Nanotechnology in Pollution Control of NOx From Stationary Sources," in Nanomaterials for the Removal of Pollutants and Resource Reutilization, Elsevier, 2019, pp. 179-211.

J. B. Condon, "Chapter 2—Measuring the Physisorption Isotherm," in Surface Area and Porosity Determinations by Physisorption, Elsevier Science, 2006, pp. 29-53.

Brief History of Thermoelectrics. (n.d.). Retrieved from http://thermoelectrics.matsci.northwestern.edu/thermoelectrics/history.html Moore, J. W., & Stanitski, C. L. (2015). Chemistry: The molecular science. Stamford, Conn.: Cengage Learning.

Lee, S., Bock, J. A., Trolier-Mckinstry, S., & Randall, C. A. (2012). Ferroelectric-thermoelectricity and Mott transition of ferroelectric oxides with high electronic conductivity. Journal of the European Ceramic Society, 32(16), 3971-3988. doi:10.1016/j.jeurceramsoc.2012.06.007

Charles A. Domenicali. Irreversible thermodynamics of thermoelectric effects in inhomogeneous, anisotropic media. Phys. Rev., 92:877-881, November 1953.

OBJECTS OF THE INVENTION

It is an object of the invention to use MOFs to adsorb $CO_2$ from the atmosphere.

It is an object of the invention to utilize the heat generated by the $CO_2$ adsorption process to create a heat gradient on a thermoelectric device.

It is an object of the invention to utilize the heat gradient created on the thermoelectric device to generate electrical current.

It is an object of the invention to use the generated electrical current to power an LED light fixture.

It is an object of the invention to capture $CO_2$ desorbed from the MOF material in a gas capture cylinder.

It is an object of the invention to provide a MOF container with MOF tunnels that fits within a canister.

It is an object of the invention to fill the MOF tunnels with powdered MOF material.

It is an object of the invention for the canister to have a gate at one end that opens and closes with a servo motor depending on the ambient temperature.

It is an object of the invention for the canister to be made of heat conducting material and have thermoelectric devices attached to the outer surface of the canister in a manner that heat is effectively conducted to one side of the thermoelectric device.

It is an object of the invention for the thermoelectric devices to be wired to connect to an LED light fixture.

It is an object of the invention for the canister to be connected via a pipe and a pump to a gas storage cylinder.

It is an object of the invention for the $CO_2$ gas desorbed from the MOF to be captured and stored a gas storage cylinder.

SUMMARY OF THE INVENTION

The present invention relates to an LED lighting fixture powered by a Metal-Organic Framework heat battery. The heat battery is formed of a canister, a MOF container comprised of a plurality of MOF tunnels, each MOF tunnel containing a powdered MOF material, a gate, and a plurality of thermoelectric devices.

Below a certain adsorption activation temperature, the MOF material adsorbs a gas from the atmosphere, in this case $CO_2$. The MOF material is chosen so adsorption activation temperature is generally consistent with the ambient nighttime temperature in most global locations. The adsorption process is exothermic and generates heat. Above a certain desorption activation temperature, normally during daytime, the MOF desorbs $CO_2$, releasing it out of the MOF material. The present invention uses the heat from the adsorption to generate electrical current. The present invention further uses the desorption to capture specific gases and remove them from the atmosphere.

The MOF container is sized to fit within the canister and is further comprised of MOF tunnels containing a powdered MOF material. The canister has a gate at one end and valves at the other. The gate is opened and closed by a servo motor based on the ambient temperature. The canister is made from a strong heat conducting metal and has thermoelectric devices arrayed on the exterior. Below the adsorption activation temperature, the gate is open, thus exposing the MOF material to the ambient atmosphere. The specific gas, in this case $CO_2$, is adsorbed into the MOF material, generating heat. This heat is applied to a thermoelectric device to generate electrical current. The electrical current powers an LED light fixture.

Above the desorption activation temperature, the gate closes and forms a gas-tight seal. The specific gas, in the preferred embodiment, $CO_2$, is desorbed. The gas is captured in the canister and pumped out of the valve, through piping and into a gas storage cylinder. The present invention enables generation of electricity at lower nighttime temperatures to power an LED light and capture of $CO_2$ adsorbed in the MOF at higher daytime temperatures.

DETAILED DESCRIPTION OF THE INVENTION

The following detailed description outlines the preferred embodiment of the claimed invention. There may be many other configurations that comport with the attached claim language and this description is in no way limiting to the scope of the invention.

The design of the disclosed invention uses the enthalpy of adsorption in MOFs in combination with thermoelectric devices to produce electricity for the lamp. A further feature of the invention is the ability to capture $CO_2$ or $H_2O$ vapor from the ambient air. This is achieved by selecting a specific adsorption material that captures one of these two gaseous compounds.

Figure 1:
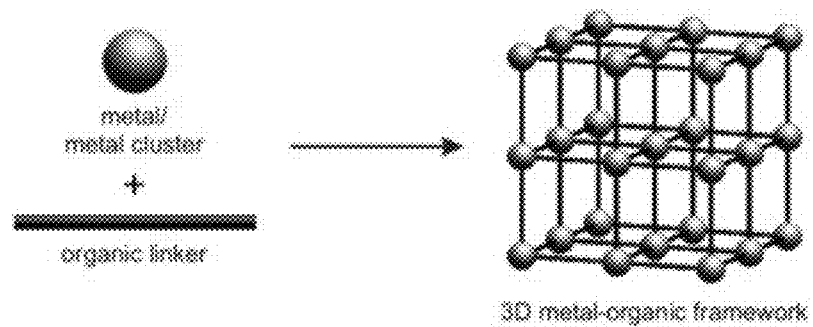
FIG. 1 shows a 3D metal-organic framework.

Metal-Organic Framework (MOF) is a solid crystalline pores material with a well-defined structure and high surface area. Work in MOFs started in the 1990s and MOF development was led by Prof. Susumu Kitagawa (Kyoto University) and Prof. Omar Yaghi (UC. Berkeley). FIG. 1 shows how MOFs are constructed by joining metal units with organic linkers, using coordination bonds to create open crystalline frameworks with permanent porosity.

Work on MOF's aimed at designing compounds possessing very large pores and high surface areas. Due to the ability to load gas molecules inside MOFs, wide applications of these devices are established. One of the early examples of Metal-Organic Framework is MOF-5 which is a Zirconium based framework (Cluster[$OZn_4(CO_2)_6$]) with benzene rings as the organic linkers(1,4-benzenedicarboxylate) resulting in a high surface area of 2500 $m^2g^{-1}$. Beside many other criteria during the reaction, changing the Metal or changing the organic linker is the main controlling tools to create new structures.

The synthesis of MOFs starts by synthesising the organic linker according to the targeted structure of functional groups needed in the framework. Using solvothermal reaction is the common method of synthesising the MOF. Synthesis starts with dissolution of both the organic linker and metal salt in amide-based solvents. Sometimes, adding a second solvent is needed to help solubilizing and controlling the reaction. The final step is to heat the mixture to lower than the boiling point of the solvents where at high temperatures and over a long period, both solvents (such as: N,N'-dimethylformamide and formic acid) work to allow the cabling between the linker and metal cluster to build and grow the crystals. Time, temperature, solvent concentration and source of the metal are important factors which led to variety of final MOF results such as: powder MOF, nano-MOF, and a single crystal MOF depending on the application desired. Variance of different factors can result in different topology. Other methods are under development for the free-solvent synthesis of MOFs using other techniques to scale up the production of MOFs.

Figure 2:
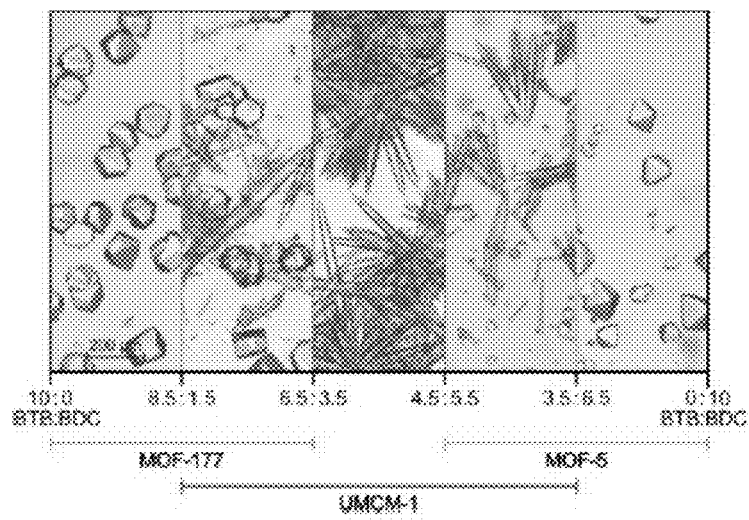
FIG. 2 shows the effect of different ratio between the two linkers in in producing different structures and properties.

Another approach for improving the MOF is post-synthesis modification (PSM) performed by introducing a new functional group to the existing structure while maintaining desired properties of the MOF. PSM enables improving the chemistry of the framework whether by adding the new functional group to the Secondary Building Unite (SBU) or the Organic linker. Moreover by PSM, the metal used in the MOF can be changed by exchanging the metal in the SBU. Secondary Building Unite is a term used in MOFs to represent the inorganic building block of the structure (polynuclear clusters of metal ions). Multivariate (MTV) MOFs is a concept refer to the creation of complex and heterogeneous structure by produce a mixed linker (more than one linker in the same MOF) or mixed metal framework. FIG. 2 shows the effect of different ratio between the two linkers in in producing different structures and properties.

MOFs are solid pore crystalline and are made up of organic and inorganic components, thus requiring different techniques for characterization. One of the basic techniques is x-ray diffraction either using the powder or single crystal techniques. Both techniques are fundamental in defining the crystallinity and the properties of the structure. In terms of investigating the porosity of the MOF, Gas Adsorption Isotherm is used which provides information about surface area and heat of adsorption of the MOF. Furthermore, the dynamic adsorption capacity of MOFs is analysed by using a breakthrough setup. Other essential equipment for analysing the MOFs include: FT-IR, TGA, ICP-MS, UV-vis, SEM, TEM and NMR.

The early development of MOFs aimed to achieve higher surface area as a solid pore crystalline material for gas storage application. However, with more investigation and discovery with MOFs, new applications have started to appear. Since the framework fixes the molecule in specific orientation, geometry, and spatial arrangement, the change we speak of can take place at a specific site (0D), along a certain path (1D), over molecules lying on a "flat" surface (2D), or over the entire crystal (3D)". Over time, the concept of "Water Harvesting" become attached to MOFs and more research supported the concept of producing water from air with low energy and high purity in a daily circulation base. Green energy applications such as capturing carbon dioxide and other contaminant opened a new window to use these materials in industry for gas purification. Moreover, MOFs have received attention in catalysis research either being used as support for nano-catalyst or creating open metal sites in the SBUs to act as catalysts. In addition, mechanochemical studies into MOFs shows their ability to absorb shockwaves in mechanical application due to the flexible features of the framework in some MOFs.

In addition to the major applications of MOFs described above such as catalysis, gas separation and gas capture/storage, MOFs also can be used as templates for growing uniform structure carbons and polymer material.

Figure 3:
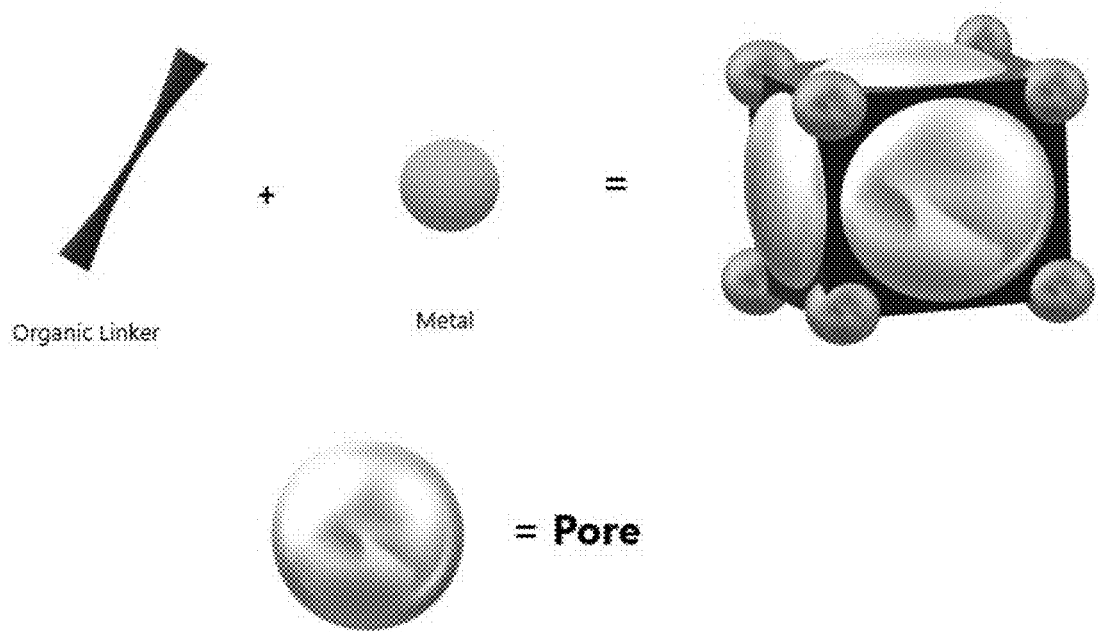
FIG. 3 shows a view of the MOF with the organic linker, the metal and the pore.

Crystallin pore solid material is a class of material that already exist in nature, an example of which is Zeolites. With further scientific research, other similar materials have been developed such Metal-Organic-Framework and Covalent-Organic-Framework. These materials (MOFs, COFs and Zeolites) are unique because of their rigid structure (crystals) that also includes pores making them like sponges, but in nanoscale. In Zeolites and MOFs the structure are consist of two building blocks: the metal and the organic linker. Contrast that with COFs, that include only organic compounds without metal involvement in the basic structure. FIG. 3 shows a view of the MOF with the organic linker, the metal and the pore.

The existence of the pores allows the structure to adsorb or store another species, especially those in gas phases such as $CO_2$, $H_2O$ and $CH_4$. This adsorption process is categorized into different type of adsorptions depending on the bonds between the adsorbate and the adsorbent. The adsorption can be categorized into these two types: physisorption or chemisorption that depends on the interaction forces (Van-der-Waals, ionic, covalent or metallic) present between both the adsorbate and the adsorbent. Physisorption or van-der-Waals adsorption is an exothermic process, generating heat, while creating weak intermolecular binding forces. These weak forces allow MOFs to adsorb different gases and enables an easier Adsorption-Desorption process. The heat associated with adsorption of a gas into solid pores material is referred to as isosteric heat of adsorption or the enthalpy of adsorption which depends on the adsorbent, the gas to be adsorbed and other related criteria including pressure and temperature.

When the adsorption process of certain gases occurs, an equal amount of energy (usually in the form of heat) must be applied as in the enthalpy of adsorption to release the gas adsorbed in the solid framework and to achieve the Adsorption-Desorption cycle of that gas. For applications such as gas separation or gas storage, a low enthalpy of adsorption is preferable to minimize the energy input needed to extract the gas out of the framework. The goal for these applications is to achieve higher capacity for the adsorbate with lower enthalpy of adsorption making it possible to store more gas while utilizing less energy when extracting it, thus resulting in lower costs.

For purposes of this patent application, the temperature at which gas adsorption or desorption starts in an MOF is the activation temperature. The specific temperature where gas adsorption begins is the adsorption activation temperature. The specific temperature where gas desorption begins is the desorption activation temperature. The MOF material chosen for the present lighting device should have an activation temperature that is near the ambient nighttime temperature of the area where the light is used. The adsorption activation temperature should be somewhere between the average ambient daytime temperature and the average ambient nighttime temperature such that gas adsorption for the MOF occurs in the night time hours and gas desorption occurs during daylight hours.

Figure 4:
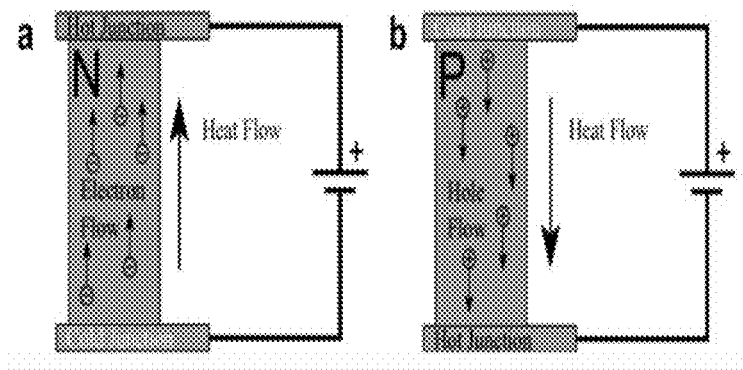
FIG. 4 shows n-type versus p-type Peltier elements.

Thermoelectric generators are solid-state thermal motors consisting of two main junctions, known as P-type (elevated positive charge concentration) and N-type (elevated negative charge concentration). The P-type components are doped to have a large number of positive charges or holes. The N-type components are doped to contain a large level of negative charges or electrons. When there is an electrical connection between the P-type element and the N-type element, an electron from the N-type moves to the P-type material for each hole that migrates to the N-type material. FIG. 4 shows electron and hole flow from a hot junction to a cold junction in a thermoelectric generator.

Figure 5:
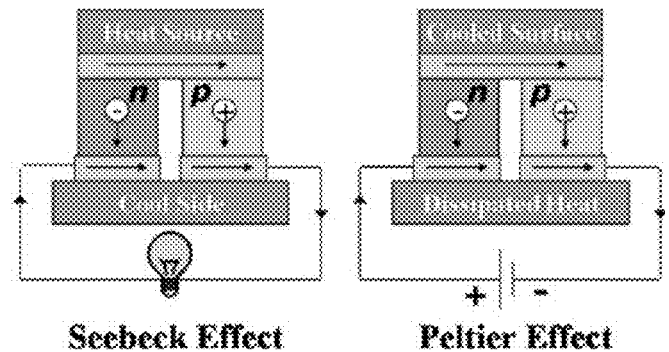
FIG. 5 shows a demonstration of the Peltier effect and the Seebeck effect.

Essential concepts related to thermoelectric generators are the Seebeck effect and the Peltier effect. The Seebeck effect is the generation of electrical voltage (current) in a curve consisting of two kinds of materials that are connected to a hot junction on one side and a cold junction on the other side. The temperature gradient creates the charge flow. The two dissimilar metals connected to form two junctions (curve) is called a thermocouple. On the other hand, the Peltier effect creates a temperature difference by applying a voltage between two electrical junctions connected to a semiconductor. The Peltier effect is used for cooling. These two effects are the inverse of the other. FIG. 5 shows diagrams of the Seebeck Effect and Peltier Effect in operation.

Figure 6:
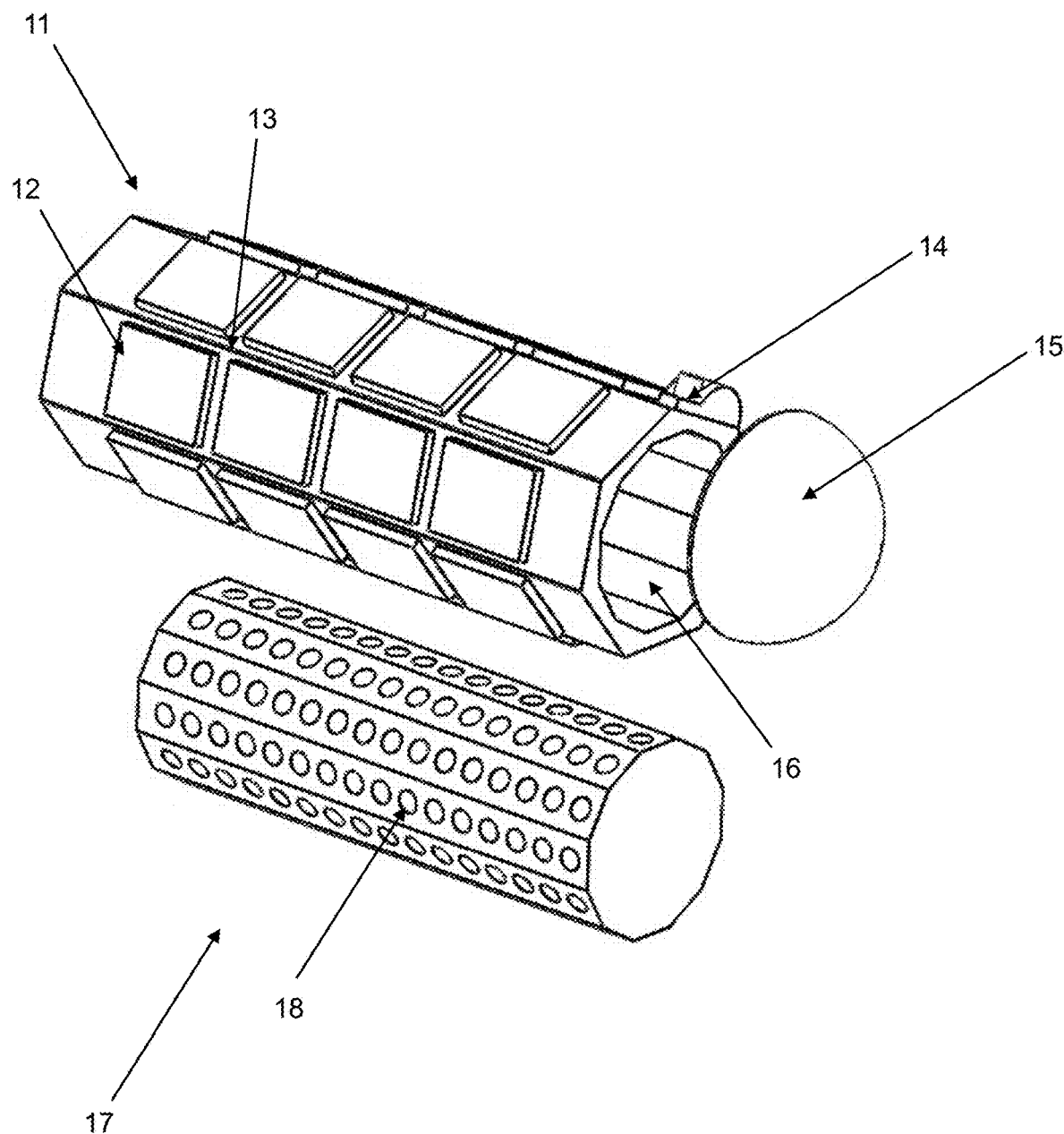
FIG. 6 shows a complete view of the canister and MOF container.

FIG. 6 shows a view of the canister 11 of the present invention with MOF container 17 removed from the interior of the canister. The canister further includes thermoelectric devices 12 arrayed around the exterior of the canister, wiring 13 connecting the thermoelectric devices to the lighting device in series, gate 15 and gate motor 14. MOF container 17 is shown removed from the canister 11. MOF container 17 is comprised of a plurality of MOF tunnels 18 that each store the MOF material for the device.

Canister 11 is made from a thin layer of heat conductive metal. In the preferred embodiment of the invention, aluminum (Al) or copper (Cu) are used, but other suitable heat conductive metals, or other heat conductive materials may be used. The walls of the canister are machined to be as thin as possible in order to effectively conduct heat generated by the MOF material to the thermoelectric devices. Canister 11 can be machined in any suitable machine shop to the desired radius and wall thickness.

Thermoelectric devices 12 generate electricity from the heat output by the exothermic adsorption process of carbon dioxide by the MOF in the MOF container 17. As described above and below, the under certain temperature conditions, the MOF material in MOF container 17 adsorbs carbon dioxide ($CO_2$). Heat is a byproduct of this adsorption process and this heat is utilized by thermoelectric devices 12 to generate electricity to power the light. Because of the highly heat conductive design of canister 11, the maximum amount of heat is conducted to the thermoelectric devices 12 in order to generate the maximum amount of electricity. These thermoelectric devices 12 are Peltier type devices and in the preferred embodiment are HiLetGo Semiconductor Refrigeration Tablets TEC1-12706 12V 6A Heatsink Thermoelectric Cooler Cooling Peltier Plate Module in a 40×40 MM size. While the above mentioned devices are used in the preferred embodiment, a variety of thermoelectric devices, of both Peltier and Seebeck variety, are suitable for this invention. The thermoelectric device utilized depends on the characteristics of the MOF material, the temperature at which adsorption and desorption occurs and the specific gas desorbed by the device.

In the preferred embodiment, 12 of these devices are installed on the exterior of canister 11. One side of the device is glued to the canister and the other side is exposed to the open air. Contact cement adhesive, as sold by Loctite brand, is applied around the edges of thermoelectric device to adhere them to the outside of the canister 11. The adhesive is applied in a way to allow maximum surface area of the thermoelectric device to be in direct contact with the metal canister 11 for maximum heat conduction and thus electricity generation. Wires 13 are connected to each of the thermoelectric devices and connected in series to the LED lighting circuit.

Gate 15 allows the interior of canister 11 to be opened or closed to ambient air. Gate 15 is normally open at low temperatures, generally at nighttime, allowing cool air to flow into the MOF material contained in the MOF container 17. In the preferred embodiment, an MOF material is chosen with an adsorption activation temperature that aligns with the ambient nighttime temperature so that during the cool temperature cycle at night, the MOF material adsorbs $CO_2$. The material is also chosen to have a desorption activation temperature that aligns with the ambient daytime temperature, so $CO_2$ is desorbed from the MOF material during daylight hours. Gate 15 is open at temperatures below the adsorption activation temperature of the MOF materials (generally at night). Gate 15 is closed above the desorption activation temperature of the MOF material, which generally occurs during the day. Gate 15 includes a gasket ring to seal the desorbed gas in the canister 11 such that it can be pumped out and stored. The gate 15 is made of the same material as the canister 11, generally a thin metal with good heat conduction such as aluminum or copper. The opening and closing of gate 15 is controlled by gate motor 14. Gate motor 14 is a low power electric servo motor powered by electricity generated by the device, of a type well known in the art, that opens and low nighttime temperatures and closes during higher day time temperatures. Gate motor 14 includes a temperature sensor that controls the opening and closing of the gate. Gate motor 14 opens gate 15 at the adsorption activation temperature of the MOF material and keeps gate 15 open whenever the temperature is below that temperature. Gate motor 14 closes gate 15 whenever the ambient temperature reaches the desorption activation temperature and keeps gate 15 closed until the temperature drops below the desorption activation temperature.

MOF container 17 contains a plurality of MOF tunnels 18 that contain MOF material. MOF container 17 is machined out of a similar heat conductive material as canister 17 such as aluminum or copper. MOF container 17 can be machined in a suitable machine shop to create the canister and MOF tunnels 18 of suitable size. MOF container 17 is removable from canister 11 so that MOF material can be inserted into the MOF tunnels 18.

MOF tunnels 18 contain the MOF material selected for the present invention. In the preferred embodiment, powder MOF sold under the tradename Basolite™ is used. MOF5 is chosen for $CO_2$ capture and replace cycle, though other types of MOFs can be used such as MOF74. MOF5 and MOF74 are the two main MOF crystal powders that are sold significant quantities for adsorbing CO2, but other specialty MOFs can be synthesized. The activation temperatures for MOF5 and MOF74 align well with daytime and nighttime temperatures in many global locations.

Choosing the specific MOF depends on the amount of heat generated to be generated by the adsorption process and the design of the battery. For example, for maximum heat output, Co-MOF74 should be selected. Co-MOF74 will generate a large amount of heat during the adsorption process. However, during the daytime desorption process, there must be enough ambient daytime heat in the geographic location to release the gases trapped inside the MOFs. In cooler climates, much closer to the normal, MOF5 would be suitable. It produces lower heat levels during the nighttime adsorption process, but also requires less heat during the daytime desorption cycle to release the gas. This approach requires more MOF material in the battery and choice of a thermoelectric device with a lower temperature gradient.

The choice of MOF material is a design choice based on the system requirements for the ambient temperatures in the geographic location of the lamp and battery. While some families of MOF74 have a lower heat of adsorption than MOF5 but most of them have higher heat of adsorption, similar to Co-MOF74. Co-MOF74 is best suited for warm climates and MOF5 works best for climates with cooler average daytime temperatures.

Figure 7:
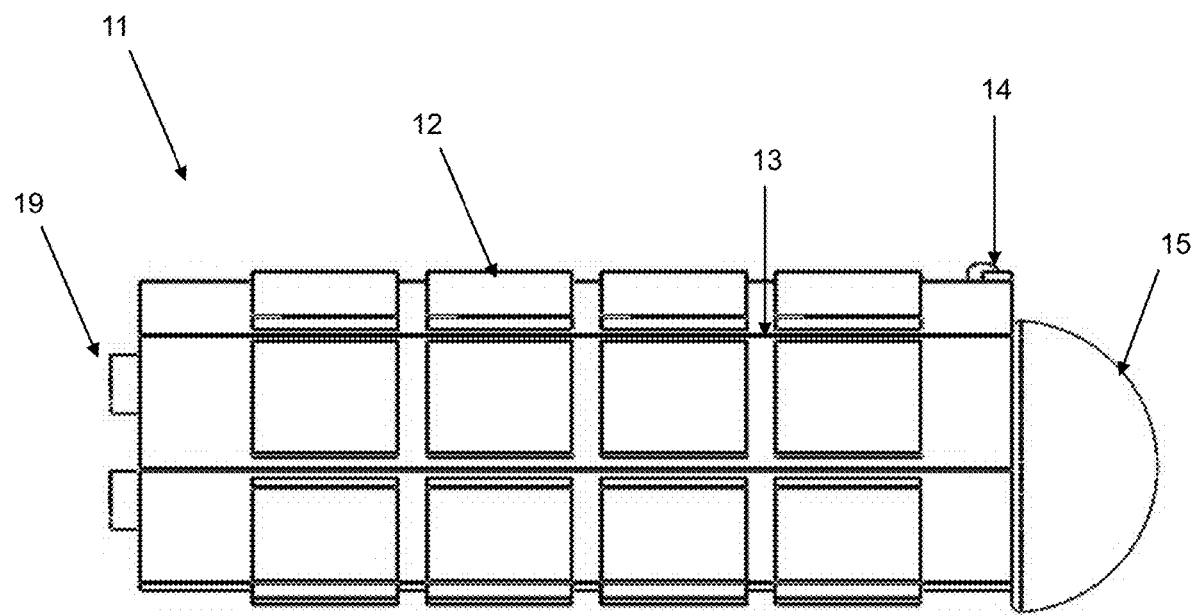
FIG. 7 shows a side view of the canister with the gate closed.

FIG. 7 shows a side view of canister 11 with thermoelectric devices 12, wiring 13, gate 15 (in the closed position) and gate motor 14. Additionally the external portion of valves 19 that are used for connecting the pipes for the desorbed $CO_2$ gas produced by the device. The pipes connected to valves 19 are connected to the pump and storage tank shown in later figures.

Figure 8A:
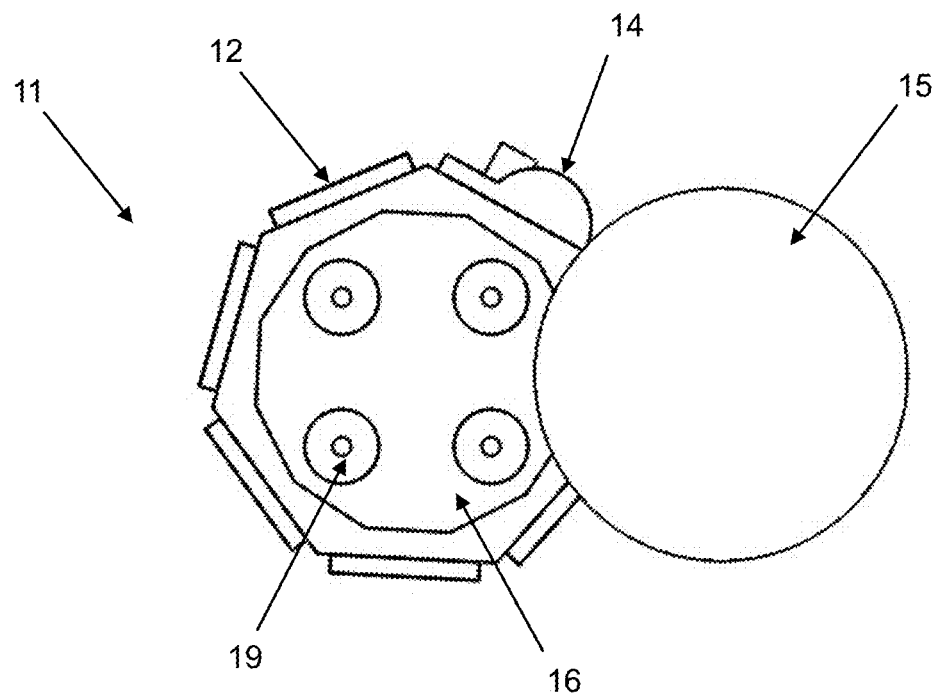
FIG. 8a shows an end view of the canister with the gate open.

FIG. 8a shows an end view of canister 11 with gate 15 in the open position. Canister cavity 16 is shown without the MOF container 17 and with the internal portion of valves 19 shown.

Figure 8B:
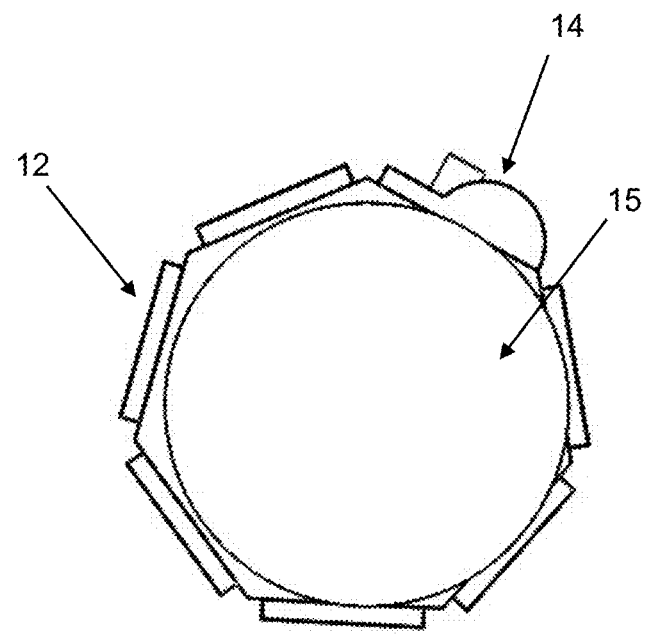
FIG. 8b shows an end view of the canister with the gate closed.

FIG. 8b shows the end view of the canister 11 with the gate 15 in the closed position.

Figure 9:
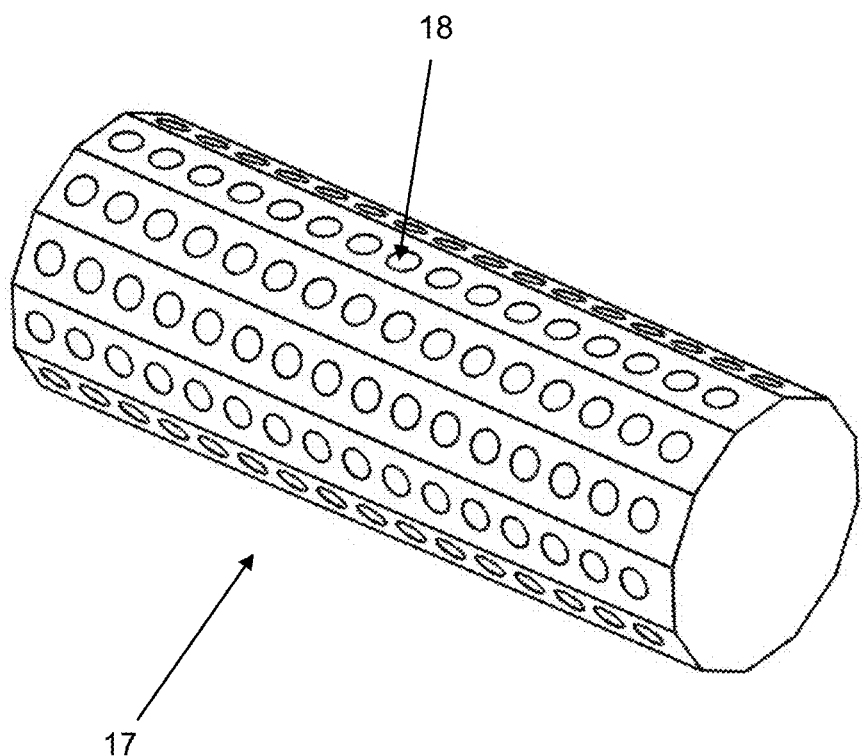
FIG. 9 shows a view of the MOF container.

FIG. 9 shows a view of the MOF container 17 with the MOF tunnels 18 visible on the surface. The powdered MOF material used for the device is placed in MOF tunnels 18. MOF container 17 fits in canister cavity 16 such that gate 15 can open and close with it in place. The canister 11 is mounted to the lamp pole (discussed below) at a 30° angle (with the gate higher than the end with the gas pipes), which helps the MOF material stay within the MOF tunnels and in the canister.

Figure 10:
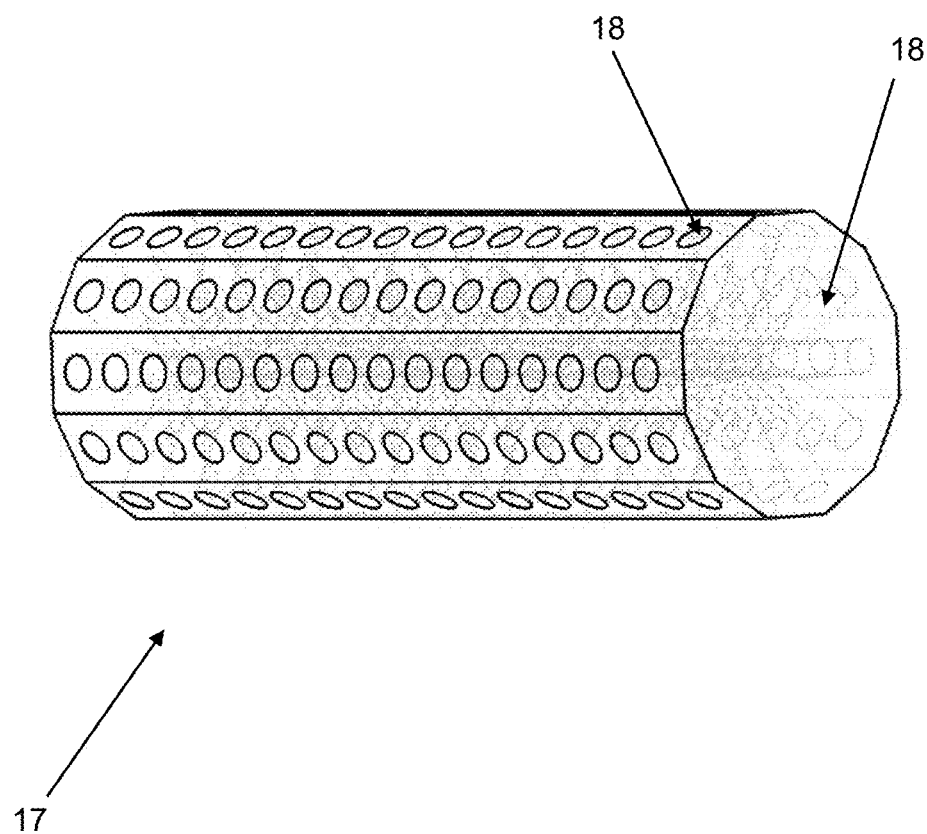
FIG. 10 shows a view of the MOF container with MOF tunnels visible.

FIG. 10 shows a view of the MOF container 17 where the MOF tunnel 18 is visible from the exterior of the MOF container 17 and the length of MOF tunnel 18 in the interior of the MOF container is shown from in a side view.

Figure 11:
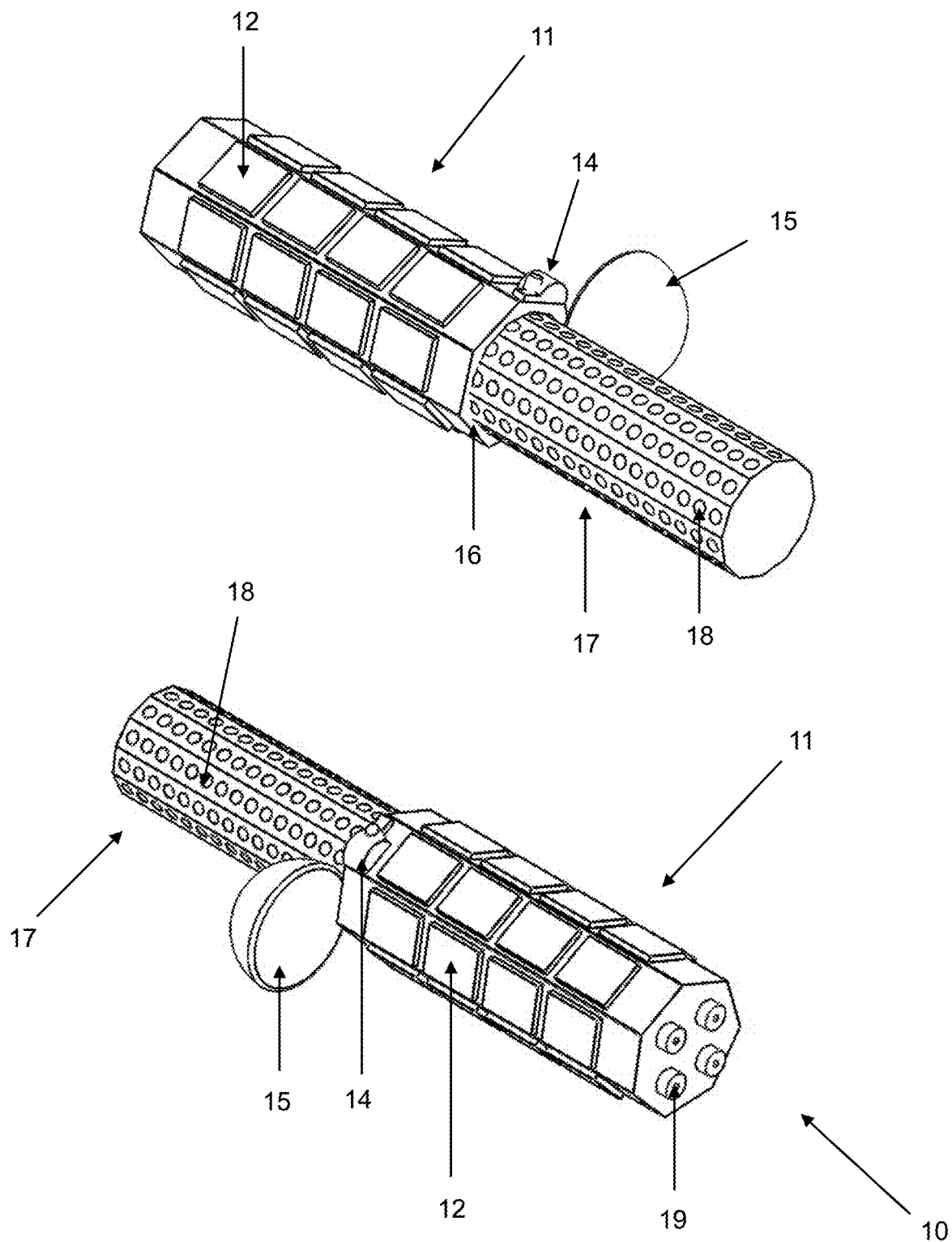
FIG. 11 shows two views of the canister with the MOF container being inserted.

FIG. 11 shows a view of both sides of canister 11 with MOF container 17 being inserted in canister cavity 16. The MOF canister 17 can be removed from the canister to insert MOF material. It is placed fully within the canister such that the gate 15 may open and close fully. In the lower view, valves 19 for connection to pipes are visible. The canister 11 is mounted to the lamp pole (discussed below) at a 30° angle (with the gate higher than the end with the gas pipes), which helps the MOF material stay within the MOF tunnels and in the canister.

Figure 12:
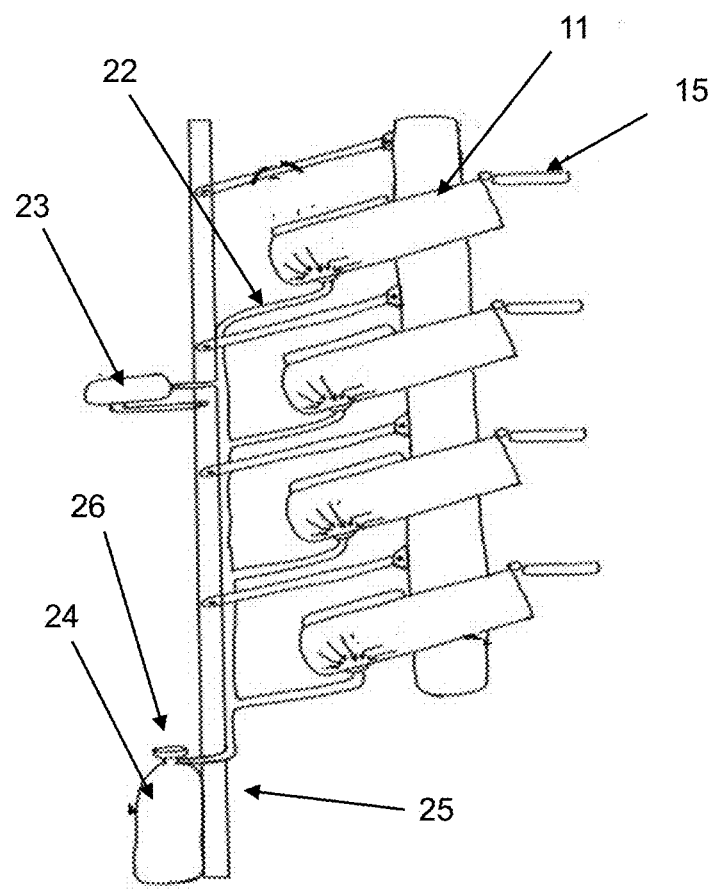
FIG. 12 shows a first embodiment of the complete LED light system.

FIG. 12 shows a view of the complete lamp apparatus. LED lamp 23 and a plurality of canisters are attached to lamp post 25. The top of lamp post 25 is tilted at a 30° angle. Canister 11 is connected to the light pole using metal glue in the preferred embodiment, with the canister 11 also angled at 30°. Each canister 11 is connected via pipes 22 to storage cylinder 24. In the preferred embodiment, pipe 22 is 2 m silicon tubing, but any gas tight flexible pipe or tubing could be substituted. The pipes 22 are sealed to the rear of the canister with vacuum glue. A standard metal scuba style 13 cubic foot aluminum tank is suitable for this purpose but any storage tank or cylinder suitable for gas storage would be appropriate. Pipes 22 are connected to pump 26 using vacuum glue. Pump 26 moves desorbed gas from canister 11 to storage cylinder 24. Pump 26 is an electric battery powered pump. A lower miniature vacuum pump, as well known in the art, is suitable for this purpose. Wires 13 (not shown) connect the thermoelectric devices, which generate electricity from heat generated in the canister 11, to the LED light 23.

LED light 23 is comprised of a circuit board with a row of LEDs mounted to the underside. The number of LEDs is dependent on the amount of light to be generated and the amount of available electrical current from the thermoelectric devices. LEDs for the device should be waterproof but the color, intensity and electrical characteristics chosen based on desired output from the light fixture. The electrical circuit board is well known in the art, with the LEDs soldered in parallel to the board using techniques well known in the art.

Figure 13:
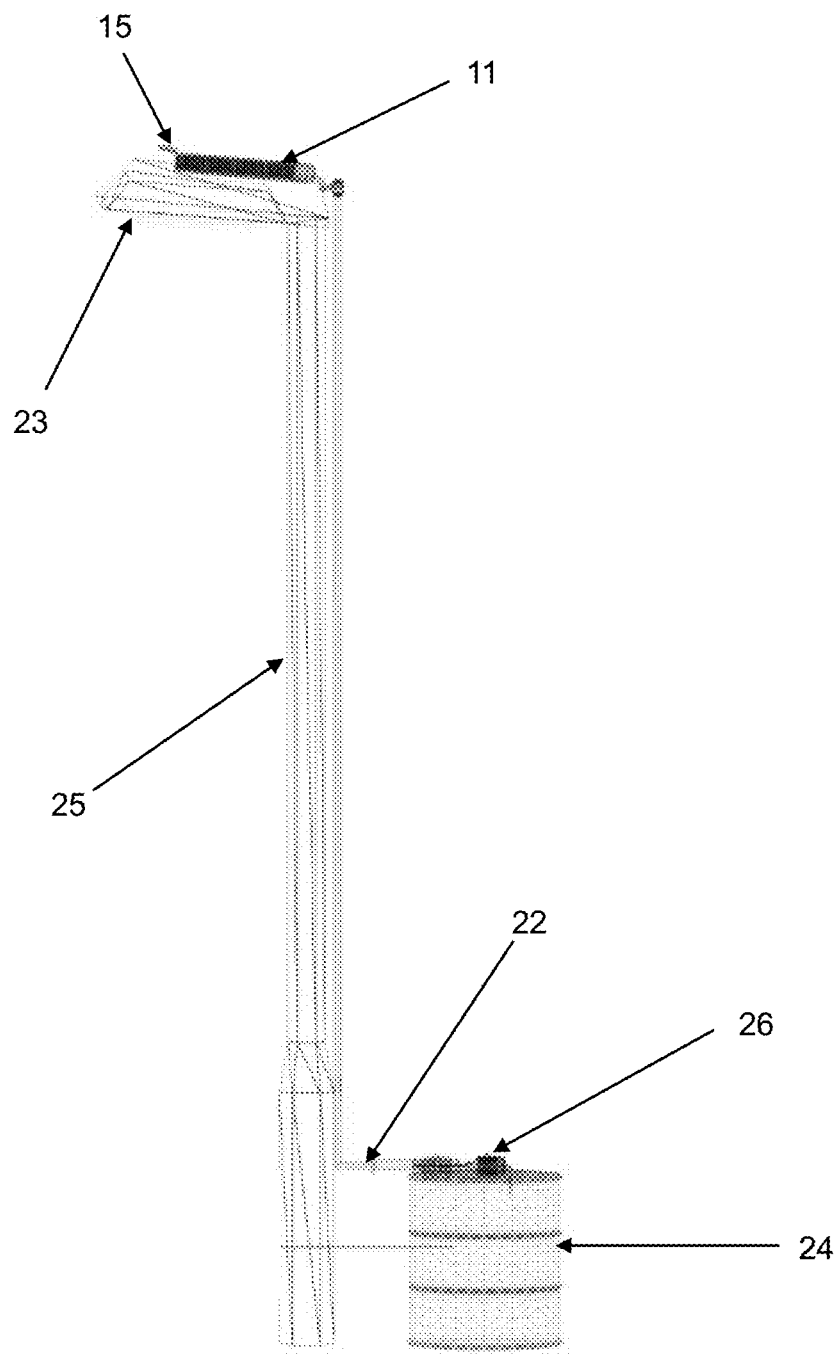
FIG. 13 shows a second embodiment of the complete LED light system.

FIG. 13 shows an alternative view of the complete lamp apparatus. The components are attached and connected in similar means to FIG. 12 but in a slightly different configuration. In this embodiment, LED lamp 23 and canister 11 are attached at the top of lamp post 25. Gate 15 opens and closes depending on the ambient temperature. The gate closes when the MOF material contained within the canister desorbs the adsorbed gas, so it can be captured and removed from the atmosphere. Pipe 22 is connected to the canister 11 at one end with pump 26 and storage cylinder 24 connected at the opposite end of the pipe. Pump 26 moves the desorbed gas from canister 11 to storage cylinder 24. Gate 15 opens when the ambient temperature is below the adsorption activation temperature. While the gate is open, the MOF material adsorbs $CO_2$ (or other various gases, depending on the MOF material). This exothermic reaction also generates heat is used to heat one side of the thermoelectric devices 12. The temperature gradient across the thermoelectric device generates electrical current which powers LED lamp 23.

The present figures and detailed description disclose the preferred embodiment of the claimed invention and are not meant to limit the scope of the claims. Many other configurations and embodiments are possible within the scope of the present claims.

The invention claimed is:

1. A light fixture comprising:
   a battery and gas storage device comprising:
   a canister with first end, a second end and a cavity, the canister having a gate at the first end and at least one valve for gas removal at the second end;
   a container for metal organic framework material, the container being shaped to fit within the cavity of the canister and having a plurality of tunnels, each tunnel being shaped to contain metal organic framework (MOF) material;
   at least one thermoelectric device attached to the exterior of the canister, the thermoelectric device attached to conduct heat from the canister wall to the thermoelectric device, the thermoelectric devices each attached to wiring configured to output a current and voltage output;
   the metal organic framework material chosen to adsorb a specified gas below a adsorption activation temperature and to desorb the specified gas above a desorption activation temperature;
   the gate having an electric motor configured to open the gate when the ambient temperature is at or below the adsorption activation temperature and to close the gate when the ambient temperature is at or above the desorption activation temperature;
   each of the at least one valves on the canister attached to a vacuum hose, the vacuum hose with a first end and a second end, the canister attached at the first end and the second end attached to a vacuum pump;
   the vacuum pump connected to a gas storage cylinder configured to store the specified gas;
   a lamp post for attaching the canister;
   a light emitting diode light attached to the lamp post; and
   the wiring attached to light emitting diode to power the light.

2. The light fixture of claim 1 where the specified gas is carbon dioxide.

3. The light fixture of claim 1 where the canister is formed of aluminum or copper.

4. The light fixture of claim 1 where the container is formed of aluminum or copper.

5. The light fixture of claim 1 where the MOF material is a powdered MOF.

6. The light fixture of claim 1 where the MOF material is MOF5.

7. The light fixture of claim 1 where the MOF material is Co-MOF74.

8. The light fixture of claim 1 where the thermoelectric device is a Peltier type device.

9. The light fixture of claim 1 where the thermoelectric device is a Seebeck type device.

10. The light fixture of claim 1 where the first end of the canister is attached to the light post at a specific angle such that the first end is lower than the second end.

11. The light fixture of claim 10 where the specific angle is 30 degrees.

* * * * *